(12) United States Patent
Muramatsu

(10) Patent No.: US 6,372,578 B1
(45) Date of Patent: Apr. 16, 2002

(54) MANUFACTURING METHOD OF NON-VOLATILE SEMICONDUCTOR DEVICE

(75) Inventor: Satoru Muramatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/695,085

(22) Filed: Oct. 25, 2000

(30) Foreign Application Priority Data

Nov. 8, 1999 (JP) .......................................... 11-317410

(51) Int. Cl.$^7$ .............................................. H01L 21/336
(52) U.S. Cl. ...................... 438/264; 438/257; 438/261; 438/591
(58) Field of Search ................................. 438/216, 261, 438/287, 591, 266, 257, 260, 263, 264, 267

(56) References Cited

FOREIGN PATENT DOCUMENTS

| JP | 7-193059 | 7/1995 |
| JP | 9-139437 | 9/1997 |

Primary Examiner—Chandra Chaudhari
Assistant Examiner—Jack Chen
(74) Attorney, Agent, or Firm—Young & Thompson

(57) ABSTRACT

The present invention relates to a method of manufacturing a non-volatile semiconductor device, having a floating gate overlying a tunnel insulating film set on a silicon substrate and a control gate overlying an inter-gate insulating film set on said floating gate; which comprises the steps of: forming a silicon oxide film on the surface of the silicon substrate and subsequently applying a heat treatment thereto in atmosphere of a nitriding gas containing nitrogen oxide so as to form a nitridation region and thereby forming a tunnel insulating film; wherein in said heat treatment performed in atmosphere of the nitriding gas, so that the maximum nitrogen atomic concentration in the tunnel insulating film that is to be formed may become equal to or greater than the maximum nitrogen atomic concentration(acceptable maximum nitrogen atomic concentration) capable to provide given acceptable holding characteristics, the pressure of said nitriding gas and the temperature of heat treatment are controlled on the basis of a pre-formed relationship equation between the thickness of the tunnel insulating film and the acceptable maximum nitrogen atomic concentration, for a prescribed thickness of the tunnel insulating film that is to be formed.

8 Claims, 4 Drawing Sheets

Thickness of tunnel insulating film (nm)

MANUFACTURING METHOD OF NON-VOLATILE SEMICONDUCTOR DEVICE

BACKGROUND OF THE INVENTION

1. Field of the Invention

The present invention relates to a manufacturing method of a non-volatile semiconductor device and more particularly to a manufacturing method of a non-volatile semiconductor device characterized by a step of forming a tunnel insulating film.

2. Description of the Related Art

In a non-volatile semiconductor device such as a flash memory, an EPROM (Erasable Programmable Read-Only Memory) or the like, at the time of writing/erasing the information, electrons are implanted/discharged between the substrate and the floating gate through the tunnel insulating film. Because the tunnel insulating film is, in these instances, subjected to stress caused by high electric field, repetition of writing/erasing the information gives rise to a problem of advancing degradation of the tunnel insulating film and lowering hold characteristics of the information.

In recent years, there have been growing demands for higher-speed operations, together with those for an improvement of element reliability and an achievement of longer life. Writing/erasing at high speed, however, accelerates degradation of the tunnel insulating film. Moreover, while it is preferable to make the tunnel insulating film thin for attaining high speed, thinning the film leads to a lowering of reliability. In short, attainments of high speed and reliability run counter to each other, and, thus, the problem of degradation of the tunnel insulating film has become a matter of great concern in respect of improvements of not only element reliability and life span but also operational characteristics.

To overcome such problems, it has been so far proposed to use a silicon oxynitride film as the tunnel insulating film.

For example, in Japanese Patent Application Laid-open No. 193059/1995, it is disclosed that, on a silicon substrate, a silicon oxide film is formed by carrying out pyrogenic oxidation with oxygen gas, and thereafter heating at 1000° C. is applied thereto in a closed pressure heating furnace while flowing through $N_2$ and $N_2O$ at atmospheric pressure, and thereby a tunnel insulating film with a thickness of 7.5 nm or so is formed. It is further mentioned therein that NO or $NO_2$ can be employed as a nitriding gas, instead of $N_2O$, and also the pressure of the nitriding gas can be lower than the atmospheric pressure. As for the temperature of heat treatment, it is described to set at 950° C. to 1050° C.

Further, Japanese Patent Application Laid-open No. 139437/1997, it is disclosed that a tunnel oxide film is formed as follows. Firstly, after a first silicon dioxide layer (with a thickness of 3.5 nm) is formed on a silicon substrate, annealing in argon atmosphere is applied thereto. Next, beneath this first silicon dioxide layer, a second silicon dioxide layer (with a thickness of 3 nm) is formed and then annealing in argon atmosphere is applied thereto. Thereafter, in $N_2O$ atmosphere, nitridation is carried out at 800° C. to 1200° C., whereby an oxynitride dielectric layer (a tunnel insulating film) with a thickness of 9.5 nm is obtained. It is also mentioned that NO can be employed instead of $N_2O$.

In each of the above publications, as a method of forming a tunnel insulating film, there is described a method in which a silicon oxide film is formed on a silicon substrate and thereafter a heat treatment is carried out in nitriding atmosphere of $N_2O$ or the like. However, in forming a tunnel insulating film made of a silicon oxynitride film, to find out the right conditions for a heat treatment with a given heat treatment apparatus, under which prescribed element characteristics can be obtained, it is, hitherto, required to fabricate elements up to a certain stage once and then evaluate their element characteristics. In effect, it is necessary to repeat fabrication of elements and subsequent their evaluation till the very conditions for the heat treatment which can provide prescribed element characteristics can be found, and thus a considerable time and effort are needed to obtain appropriate conditions for a heat treatment. Further, even after conditions for a heat treatment are determined, because it cannot be known appropriately whether the formed tunnel insulating film can really demonstrate prescribed element characteristics or not, immediately after the tunnel insulating film is formed, there is always the possibility of proceeding formation of elements with poor reliability and, consequently, lowering the yield in production.

SUMMARY OF THE INVENTION

An object of the present invention is to provide a manufacturing method that can easily fabricate a non-volatile semiconductor device having a tunnel insulating film capable to demonstrate prescribed element characteristics.

The present invention relates to a method of manufacturing a non-volatile semiconductor device, having a floating gate overlying a tunnel insulating film set on a silicon substrate and a control gate overlying an inter-gate insulating film set on said floating gate; which comprises the steps of:

forming a silicon oxide film on the surface of the silicon substrate and subsequently applying a heat treatment thereto in atmosphere of a nitriding gas containing nitrogen oxide so as to form a nitridation region and thereby forming a tunnel insulating film; wherein in said heat treatment performed in atmosphere of the nitriding gas, so that the maximum nitrogen atomic concentration in the tunnel insulating film that is to be formed may become equal to or greater than the maximum nitrogen atomic concentration(acceptable maximum nitrogen atomic concentration) capable to provide given acceptable holding characteristics, the pressure of said nitriding gas and the temperature of heat treatment are controlled on the basis of a pre-formed relationship equation between the thickness of the tunnel insulating film and the acceptable maximum nitrogen atomic concentration, for a prescribed thickness of the tunnel insulating film that is to be formed.

Further, the present invention relates to a method of manufacturing a non-volatile semiconductor device, having a floating gate overlying a tunnel insulating film set on a silicon substrate and a control gate overlying an inter-gate insulating film set on said floating gate; which comprises the steps of:

forming a silicon oxide film on the surface of the silicon substrate and subsequently applying heat treatment thereto in atmosphere of a nitriding gas containing nitrogen oxide so as to form a nitridation region and thereby forming a tunnel insulating film; wherein in said heat treatment performed in atmosphere of the nitriding gas, the pressure of said nitriding gas and the temperature of heat treatment are controlled in such a way that there is formed, within said tunnel insulating film, a nitridation region having nitrogen atomic concentrations that satisfy the following Equation (1) for a prescribed thickness of the tunnel insulating film that is to be formed;

$$C_N \geq -1.02T + 13.4 \quad (1),$$

$C_N$: the nitrogen atomic concentration (atomic %) in the tunnel insulating film T: the thickness of the tunnel insulating film (nm).

The present invention makes it possible to fabricate easily a non-volatile semiconductor device having a tunnel insulating film capable to demonstrate prescribed element characteristics with high yield.

DETAILED DESCRIPTION OF THE PREFERRED EMBODIMENTS

Figure 1:
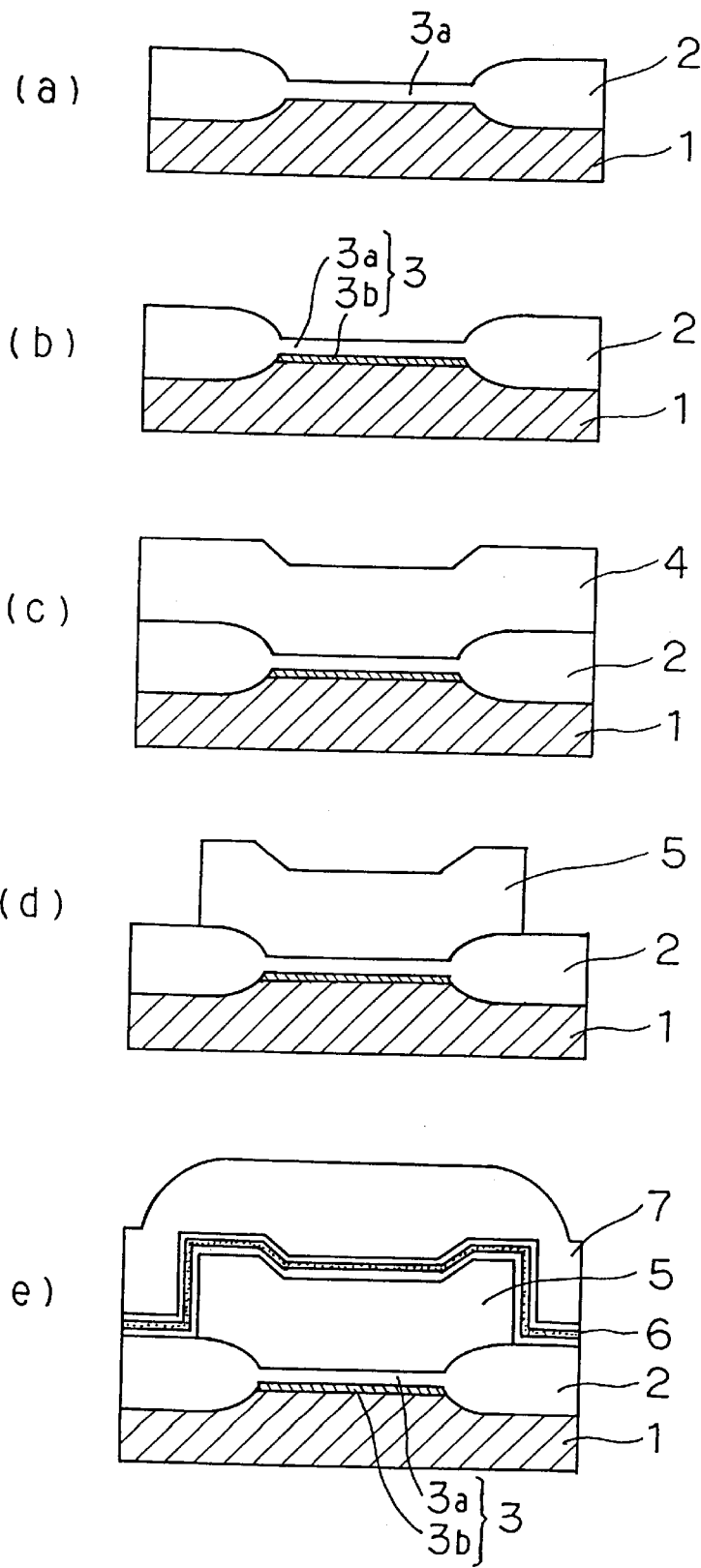
FIG. 1 is a series of cross-sectional views illustrating the steps of a manufacturing method of a non-volatile semiconductor device according to the present invention.

Taking a manufacturing method of a flash memory as an example, the preferred embodiment of the present invention is described in detail below.

First, as shown in FIG. 1(a), element isolation regions 2 are formed on a silicon substrate 1 by an ordinary method, and a silicon oxide film is formed on the surface of the silicon substrate. Through this silicon oxide film, ion implantation of dopants such as boron is, then, applied over the surface of the silicon substrate so as to set a prescribed threshold value. Next, after this silicon oxide film is removed, a silicon oxide film 3a is formed by the thermal oxidation method or the like.

Next, as shown in FIG. 1(b), by performing a heat treatment in atmosphere of a nitriding gas containing nitrogen oxide, a nitridation region 3b is formed and thereby a tunnel insulating film 3 is made up. Hereat, the time and the temperature of heat treatment and the pressure of the nitriding gas are controlled so that a nitridation region having nitrogen atomic concentrations satisfying the above-mentioned Equation (1) for a given thickness of the tunnel insulating film may be formed within the tunnel insulating film.

Next, as shown in FIG. 1(c), a polysilicon layer 4 that is to serve later as a floating gate is grown over the entire surface by the CVD (Chemical Vapour Deposition) method. The dopants to provide the conductivity can be introduced thereinto, together with forming the polysilicon layer or afterwards through ion implantation. In this instance, concurrently with formation of the polysilicon layer, N-type dopants such as P are introduced thereinto.

Next, as shown in FIG. 1(d), the polysilicon layer 4 is patterned by means of lithography and dry etching to form a floating gate 5.

Next, as an inter-gate insulating film 6, an ONO film (a silicon oxide film/a silicon nitride film/a silicon oxide film) is formed by the CVD method or the like, as shown in FIG. 1(e). Following that, after a polysilicon layer is formed by the CVD method over the entire surface, ion implantation of N-type dopants such as P and, then, patterning by means of lithography and dry etching are applied thereto, which forms a control gate 7.

Subsequently, for source-drain formation, ion implantation of dopants is carried out by an ordinary method.

In this way, there can be accomplished of manufacturing a flash memory having a floating gate overlying a tunnel insulating film set on a silicon substrate and a control gate overlying an inter-gate insulating film set on this floating gate.

In the manufacturing method described above, the steps of forming a silicon oxide film on the surface of the silicon substrate and thereafter applying a heat treatment thereto in atmosphere of a nitriding gas containing nitrogen oxide so as to form a nitridation region and thereby forming a tunnel insulating film are further described below.

In respect of the thickness of the tunnel insulating film, when hold characteristics, durability and reliability as well as easiness of nitridation region formation are considered, it is preferable to set the film thick, but to achieve higher speed operations (writing/erasing) or lower voltages for operations, it is preferable to set the film thin. With this tunnel insulating film obtained by applying a heat treatment to a silicon oxide film in atmosphere of a nitriding gas, as it has a greater mechanical strength than the conventional tunnel insulating film made of a silicon oxide film, it can provide satisfactory hold characteristics, durability and reliability, even with a relatively little thickness. Taking all the points mentioned above into account, in a manufacturing method of the present invention, the tunnel insulating film may be formed by selecting appropriately a thickness thereof in a range between the lower limit that is set, for example, at or above 4 nm, and preferably at or above 5 nm and still more preferably at or above 6 nm and the upper limit that is set, for example, at or below 12 nm, and preferably at or below 11 nm and still more preferably at or below 10 nm.

As nitrogen oxide, there can be cited NO, $N_2O$, $NO_2$ or the like, and besides a mixture of more than two of these can be utilized. However, NO is the most preferable among them. A nitriding gas containing such nitrogen oxide can be a simple substance gas that consists of nitrogen oxide alone, or a mixed gas in which an inert gas such as nitrogen, helium, argon or the like is mixed with nitrogen oxide. A simple substance gas of NO or a mixed gas of NO and an inert gas is particularly preferable.

Figure 2:
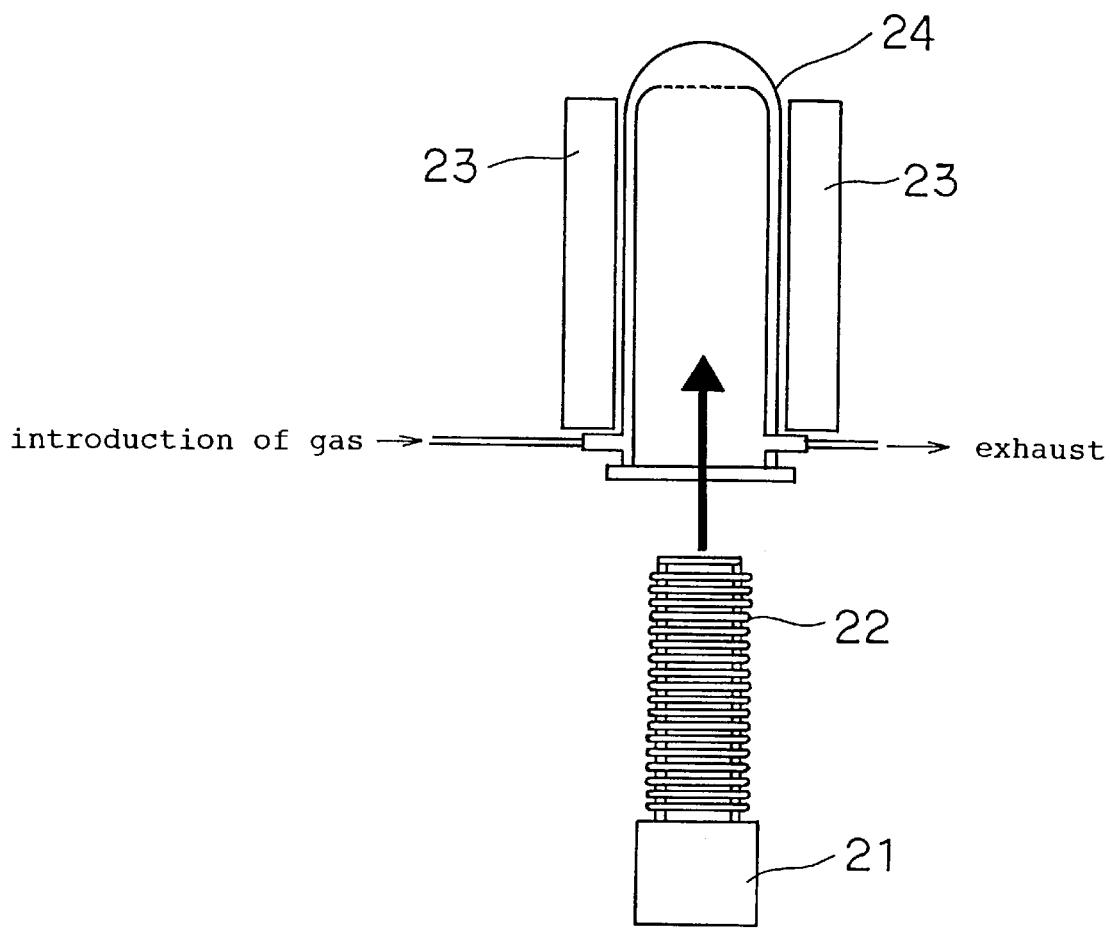
FIG. 2 is a schematic view showing an example of the structure of a diffusion furnace used in the step of heat treatment of the present invention.
Figure 3:
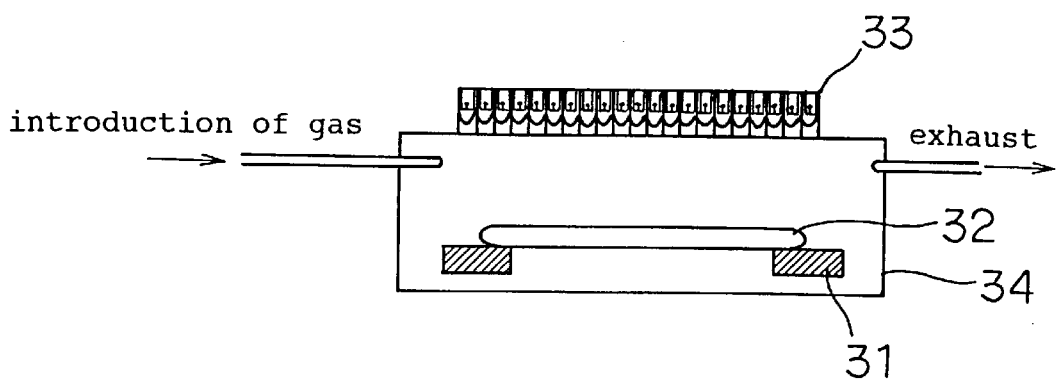
FIG. 3 is a schematic view showing an example of the structure of a ramp annealing apparatus used in the step of heat treatment of the present invention.

When a mixed gas of this sort is utilized as the nitriding gas, it is necessary to set the time of heat treatment considerably long so that a diffusion furnace as shown in FIG. 2 is preferably used. On the other hand, when nitrogen oxide alone or a mixed gas containing high-concentration nitrogen oxide is employed, as the time of heat treatment can be relatively short, a ramp annealing apparatus as shown in FIG. 3 can be used. In FIG. 2, referential numerals 21, 22, 23 and 24 represent a boat, a wafer, a heating element and a tube, respectively. In FIG. 3, referential numerals 31, 32, 33 and 34 represent a holder, a wafer, a lamp and a chamber.

Regarding the method of heat treatment, a method using a diffusion furnace has an advantage of high productivity, as numerous wafers can be subjected all at once to a heat treatment, even though the heat treatment in this method must run for a relatively long rime. As a diffusion furnace, an ordinary diffusion furnace called a heat treatment furnace may be used. As against this, the ramp annealing method can provide high controllability over formation of a nitridation region in the tunnel insulating film and, at the same time, can restrain well the change of the dopant profile which may be caused by the thermal diffusion because rising or lowering the temperature, in this method, can be made with a very short time period. With ramp anneal, 30 seconds to 5 minutes of a treatment can accomplish sufficient nitridation.

While the temperature of heat treatment in atmosphere of the nitriding gas must be appropriately selected to suit the type of the heat treatment apparatus, the whole pressure or the partial pressure of nitrogen oxide in the system and the thickness of the tunnel insulating film that is to be formed, it is set preferably at or above 850° C. and more preferably at or above 900° C. and still more preferably at or above 950° C. in order to make sufficient nitridation within a prescribed time period. Further, the maximum temperature of heat treatment is set preferably at or below 1200° C. and more preferably at or below 1150° C. and still more preferably, at or below 1100° C., considering the limit for heat-resistance of the apparatus and control of the change in the dopant profile that may be caused by thermal diffusion.

The heat treatment in atmosphere of the nitriding gas is preferably carried out at atmospheric pressure or a reduced pressure below the atmospheric pressure, but, viewed from the points of the gas consumption (a loss of unreacted gas that may occur at the time of exhaust while wafers are removed therefrom or such), controllability of the nitriding reaction and safety, a reduced pressure below the atmospheric pressure is preferably employed. In the case of low pressure heat treatment, for example, a pressure not less than $1.33322 \times 10^2$ Pa (1 Torr) but not greater than $7.99932 \times 10^4$ Pa (600 Torr) can be selected.

What matters the most in the present invention is, in the step of heat treatment performed in atmosphere of the nitriding gas containing nitrogen oxide, so that the maximum nitrogen atomic concentration in the tunnel insulating film that is to be formed may become equal to or greater than the maximum nitrogen atomic concentration ("acceptable maximum nitrogen atomic concentration") capable to provide given acceptable holding characteristics, the pressure of said nitriding gas and the temperature of heat treatment are controlled on the basis of a pre-formed relationship equation between the thickness of the tunnel insulating film and the acceptable maximum nitrogen atomic concentration, for a prescribed thickness of the tunnel insulating film that is to be formed. For instance, the pressure of the nitriding gas and the temperature of heat treatment are controlled in such a way that there is formed, within the tunnel insulating film, a nitridation region having nitrogen atomic concentrations that satisfy the above-mentioned Equation (1) for the thickness of the tunnel insulating film.

Depending on the type of heat treatment apparatus or method, the time of heat treatment is set appropriately in an almost specific range for the sake of productivity and controllability. Within this range for the time of heat treatment, for the sake of productivity, it is preferably set as short as possible, provided that the controllability is not marred.

The present inventor, having conducted investigations in which tunnel insulating films were formed by carrying out heat treatments in atmosphere of a simple substance gas of NO under various conditions and evaluations were made over respective elements obtained, observed that for any given thickness of the tunnel insulating film, there is a close correlation between the NO gas pressure and the temperature of heat treatment necessary for the elements to obtain acceptable hold characteristics, and reached the present invention.

Figure 4:
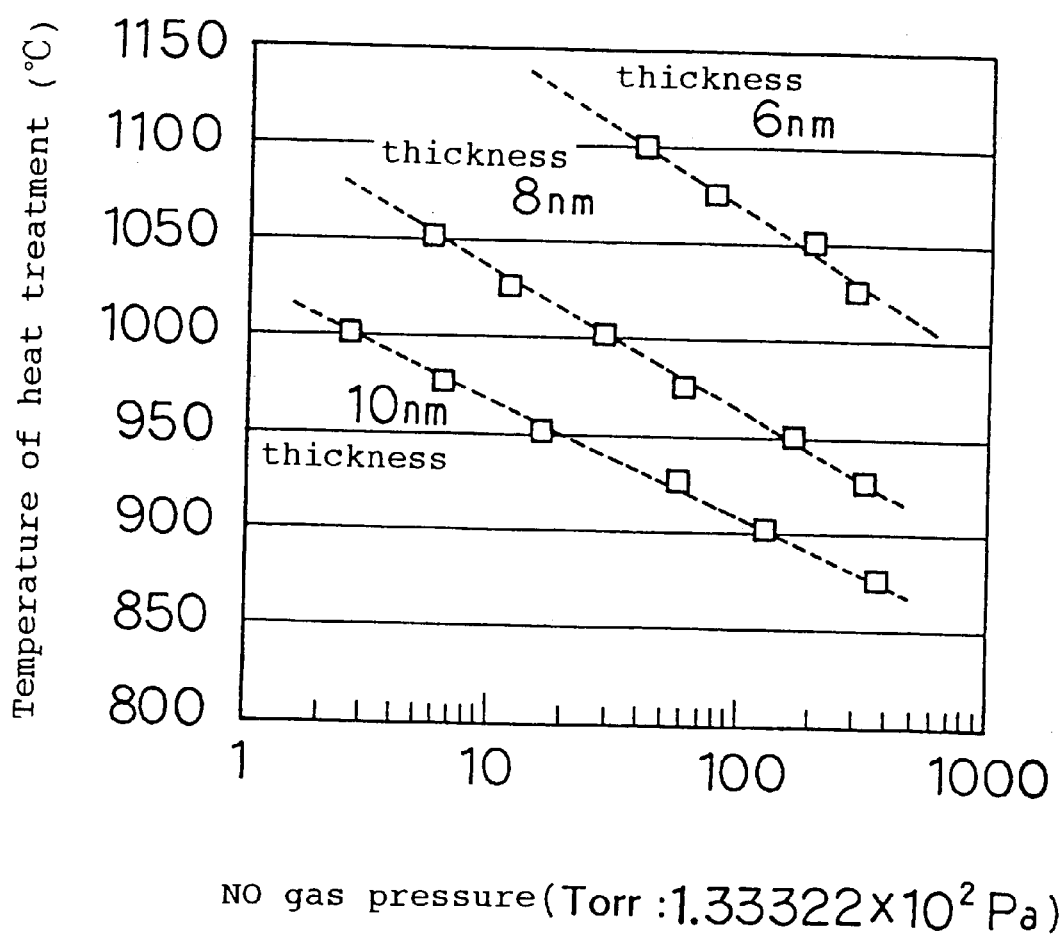
FIG. 4 is a graph showing the relationship between the NO gas pressure and the temperature of heat treatment necessary to obtain the acceptable hold characteristics for elements with different thicknesses of the tunnel insulating film.

FIG. 4 shows the relationship between the NO gas pressure and the temperature of heat treatment that are necessary for fabricated elements to demonstrate acceptable hold characteristics, for elements having tunnel insulating films with thickness of 6 nm, 8 nm and 10 nm, respectively. The heat treatment was carried out by ramp anneal for 1 minute (temperature rising rate: 50° C./sec and temperature lowering rate: 50° C./sec). Further, the leakage current was used as an indicator of acceptable hold characteristics and the acceptable leakage current was set to be $10^{-15}$ A/cm$^2$.

In the measurements of the leakage current, a stress current, which is equivalent to writings/erasings of 100000 times, was applied to each sample element having a structure in which a floating gate was fabricated as shown in FIG. 1($d$), and thereafter terminals were each set on the backside of the substrate 1 and the top surface of the floating gate 5, and then the leakage current therebetween was measured. The thickness of the floating gate was 150 nm and the dopant (P) concentration thereof was $3 \times 10^{19}$/cm$^3$ to $1 \times 10^{20}$/cm$^3$. The thickness of the tunnel insulating film was measured by the ellipsometry method.

AS seen clearly in FIG. 4, for respective film thicknesses, the relationship between the NO gas pressure and the temperature of heat treatment can be expressed by a first order equation, and, in order to obtain prescribed hold characteristics, the lower the NO gas pressure is set, the higher the temperature of heat treatment must be set. The graph also shows that, as the tunnel insulating film becomes thinner, the temperature and pressure required become higher. This indicates that, to obtain prescribed hold characteristics, it is necessary to conduct nitridation more than a certain degree the amount of which depends on the thickness of the tunnel insulating film. For example, in FIG. 4, prescribed hold characteristics can be obtained for elements with each film thickness, if a heat treatment is carried out under the conditions of a NO gas pressure and a temperature of heat treatment, a combination of which belong to the region above the straight line depicted by a dotted line for each film thickness in the graph.

Figure 5:
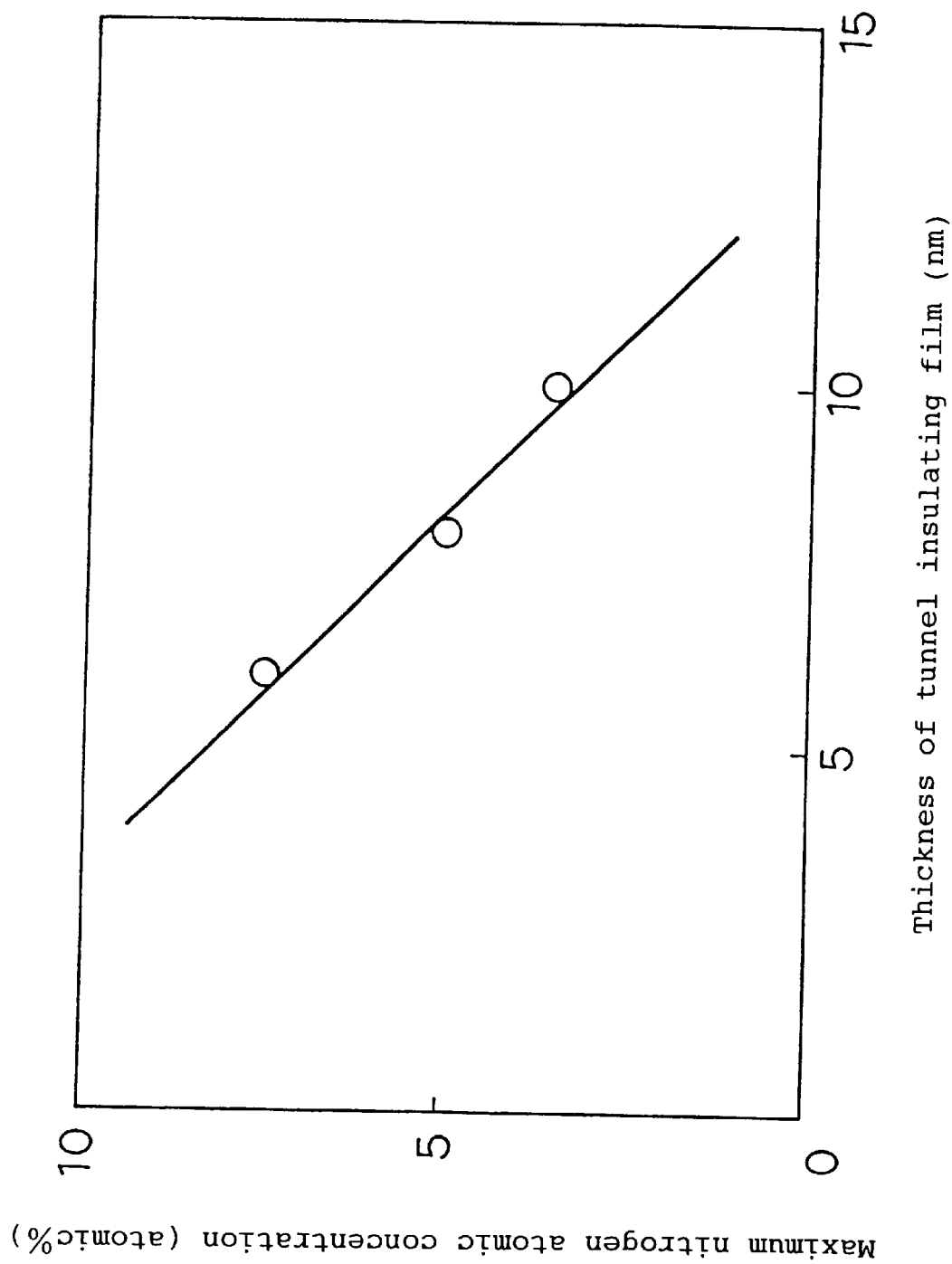
FIG. 5 is a graph showing the relationship between the thickness of the tunnel insulating film and the maximum nitrogen atomic concentration necessary to obtain the acceptable hold characteristics.

Now, the present inventors substituted the maximum nitrogen atomic concentration in the nitridation region within the tunnel insulating film for the degree of nitridation attained by carrying out a heat treatment in atmosphere of the nitriding gas containing nitrogen oxide, and, using elements with the structure which show the above-mentioned acceptable leakage current, conducted measurements of the maximum nitrogen atomic concentration in the tunnel insulating film against various thicknesses of the tunnel insulating film. The results are as follows; 7.5 atomic % for elements with a film thickness of 6 nm, 5.0 atomic % for those with a film thickness of 8 nm and 3.5 atomic % for those with a film thickness of 10 nm. When these values are plotted, the relationship between the thickness of the tunnel insulating film and the maximum nitrogen atomic concentration can be approximated by a first order equation, as shown in FIG. 5, giving the above-mentioned Equation (1) as the conditions of the heat treatment.

Hereat, the relationship between the thickness of the tunnel insulating film and the maximum nitrogen atomic concentration is approximated by the first order equation as one embodiment, but other equations of approximation such as a second order equation or the like can be utilized. Further, the above-mentioned Equation (1) was obtained, using the leakage current as an indicator of hold characteristics and, in addition, being based on the acceptable value of the leakage current which was arbitrarily set under the above conditions of the measurement. For holding characteristics, an indicator other than the leakage current can be chosen appropriately. Furthermore, in place of the above-mentioned Equation (1), other conditional equations may be obtained by setting other conditions of the measurement or other acceptable values.

The measurements of the maximum nitrogen atomic concentration within the tunnel insulating film were made, after forming the tunnel insulating film, by the SIMS (Secondary Ion Mass Spectroscopy). These measurements showed clearly that the nitriding reaction proceeds from the vicinity of the interface between the silicon substrate and the silicon oxide film and the degree of this nitridation displays some distribution. The distribution of the nitrogen atomic concentration in the tunnel insulating film is such that the nitrogen concentration is highest at about the interface level and gradually decreases with increasing distance from the interface level. In the present invention, the maximum in the nitrogen atomic concentration distribution along the direction of the thickness of the tunnel insulating film is designated as the maximum nitrogen atomic concentration.

In the silicon oxide film formed to serve as a tunnel insulating film, dangling bonds of Si atoms and imperfect Si—O bonds are generally present. By the heat treatment in atmosphere of the nitriding gas containing nitrogen oxide, Si atoms with dangling bonds and Si atoms with imperfect Si—O bonds undergo nitridation in the first instance. Since Si—N bonds in the tunnel insulating film formed in this manner are stronger than Si—O bonds in the silicon oxide film and, thus, harder to break, they can increase the mechanical strength of the tunnel insulating film, which provides satisfactory hold characteristics, together with high durability, even if the film is considerably thin, and heightens reliability.

As seen clearly in FIG. 5, to obtain hold characteristics better than the mere acceptable hold characteristics, it is necessary to form a tunnel insulating film having a nitridation region where the maximum nitrogen atomic concentration is greater than the specific concentration for a given thickness of the tunnel insulating film. Further, it is apparent from FIG. 5 that the thinner the tunnel insulating film becomes, the higher the nitrogen atomic concentration (the maximum nitrogen atomic concentration) in the tunnel insulating film must be set.

In the present invention, by measuring the thickness and the nitrogen atomic concentration of a tunnel insulating film immediately after forming the tunnel insulating film and using a conditional equation which has been obtained beforehand, for example, Equation (1), whether hold characteristics better than the acceptable hold characteristics can be attained or not can be judged. Accordingly, in comparison with the conventional method in which elements must be fabricated up to a certain stage to evaluate hold characteristics, the optimum conditions of heat treatment can be easily found out.

Further, also after conditions of heat treatment are determined, by measuring the nitrogen atomic concentration in the tunnel insulating film immediately after forming the tunnel insulating film, it is possible to examine appropriately whether the formed tunnel insulating film can demonstrate prescribed hold characteristics or not so that formation of elements with high reliability becomes easier to achieve and the yield in production, improved. Especially when numerous wafers are subjected to a heat treatment all at once, the conditions of heat treatment are liable to fluctuate even within one and the same apparatus, and the degree of nitridation in the tunnel insulating film may vary with the position where a wafer is placed during the heat treatment and there is a possibility that elements which do not have prescribed hold characteristics may be included. The present invention provides means to find out a wafer without sufficient nitridation prior to the completion of element formation. This can be done, for example, by placing a dummy wafer at a specific position and measuring the thickness and the nitrogen atomic concentration of the tunnel insulating film in the dummy wafer. In this manner, the optimization of conditions for heat treatment within the apparatus can be made readily, which can reduce the defect rate of the products.

What is claimed is:

1. A method of manufacturing a non-volatile semiconductor device, having a floating gate overlying a tunnel insulating film set on a silicon substrate and a control gate overlying an inter-gate insulating film set on said floating gate; which comprises the steps of:

forming a silicon oxide film on a surface of the silicon substrate and subsequently applying a heat treatment thereto in an atmosphere of a nitriding gas containing nitrogen oxide so as to form a nitridation region and thereby forming a tunnel insulating film; wherein in said heat treatment performed in the atmosphere of the nitriding gas, so that a maximum nitrogen atomic concentration in the tunnel insulating film that is to be formed becomes equal to or greater than an acceptable maximum nitrogen atomic concentration capable to provide given acceptable holding characteristics, the pressure of said nitriding gas and the temperature of heat treatment are controlled on the basis of a preformed relationship equation between the thickness of the tunnel insulating film and the acceptable maximum nitrogen atomic concentration, for a prescribed thickness of the tunnel insulating film that is to be formed.

2. The method of manufacturing a non-volatile semiconductor device according to claim 1, wherein the thickness of said tunnel insulating film is set to be not less than 4 nm but not greater than 12 nm.

3. The method of manufacturing a non-volatile semiconductor device according to claim 1, wherein said heat treatment in atmosphere of a nitriding gas is carried out below atmospheric pressure.

4. The method of manufacturing a non-volatile semiconductor device according to claim 1, wherein either a simple substance gas of NO or a mixed gas of NO and an inert gas is utilized as said nitriding gas.

5. A method of manufacturing a non-volatile semiconductor device, having a floating gate overlying a tunnel insulating film set on a silicon substrate and a control gate overlying an inter-gate insulating film set on said floating gate; which comprises the steps of:

forming a silicon oxide film on a surface of the silicon substrate and subsequently applying a heat treatment thereto in an atmosphere of a nitriding gas containing nitrogen oxide so as to form a nitridation region and thereby forming a tunnel insulating film; wherein in said heat treatment performed in the atmosphere of the nitriding gas, the pressure of said nitriding gas and the temperature of heat treatment are controlled in such a way that there is formed, within said tunnel insulating film, a nitridation region having nitrogen atomic concentrations that satisfy the following Equation (1) for a prescribed thickness of the tunnel insulating film that is to be formed;

$$C_N \geq -1.02\, T + 13.4 \qquad (1),$$

$C_N$: the nitrogen atomic concentration (atomic %) in the tunnel insulating film T: the thickness of the tunnel insulating film (nm).

6. The method of manufacturing a non-volatile semiconductor device according to claim 5, wherein the thickness of said tunnel insulating film is set to be not less than 4 nm but not greater than 12 nm.

7. The method of manufacturing a non-volatile semiconductor device according to claim 5, wherein said heat treatment in atmosphere of a nitriding gas is carried out below atmospheric pressure.

8. The method of manufacturing a non-volatile semiconductor device according to claim 5, wherein either a simple substance gas of NO or a mixed gas of NO and an inert gas is utilized as said nitriding gas.

* * * * *